US007550740B2

(12) United States Patent
Takeuchi et al.

(10) Patent No.: US 7,550,740 B2
(45) Date of Patent: Jun. 23, 2009

(54) FOCUSED ION BEAM APPARATUS

(75) Inventors: Koichiro Takeuchi, Hitachinaka (JP);
Tohru Ishitani, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 152 days.

(21) Appl. No.: 11/828,714

(22) Filed: Jul. 26, 2007

(65) Prior Publication Data
US 2008/0023641 A1  Jan. 31, 2008

(30) Foreign Application Priority Data
Jul. 27, 2006 (JP) ............................. 2006-204398

(51) Int. Cl.
G21K 1/093 (2006.01)
H01J 29/58 (2006.01)
H01J 29/64 (2006.01)
H01J 37/21 (2006.01)

(52) U.S. Cl. .................... 250/396 ML; 250/396 R; 250/298; 250/423 R; 250/492.2; 250/492.22

(58) Field of Classification Search .......... 250/396 ML, 250/396 R, 298, 423 R, 492.2, 492.22
See application file for complete search history.

(56) References Cited

U.S. PATENT DOCUMENTS 7,105,833 B2 * 9/2006 Brunner et al. ......... 250/396 R
7,411,192 B2 * 8/2008 Takeuchi et al. ............ 250/311

FOREIGN PATENT DOCUMENTS

| JP | 7-296756 A | 11/1995 |
| JP | 11-329318 A | 11/1999 |
| JP | 11-329320 A | 11/1999 |
| JP | 2006-40809 A | 2/2006 |

* cited by examiner

Primary Examiner—Nikita Wells
(74) Attorney, Agent, or Firm—Crowell & Moring LLP

(57) ABSTRACT

A focused ion beam apparatus enables an ion beam to be focused highly accurately on a sample at the beam spot position of the case of the absence of magnetic field without causing isotope separation of the ion beam on the sample, even when there is a magnetic field on the ion beam optical axis or the magnetic field fluctuates. The focused ion beam apparatus comprises a corrective magnetic field generating unit 10 disposed on the optical axis of the ion beam 3 for correcting the deflection of the ion beam 3 due to an external magnetic field. The corrective magnetic field generating unit 10 includes pole-piece pairs 26A and 26B, each of which having two pole pieces 26a and 26b or 26c and 26d that are adjacent to each other with a gap d. The pole-piece pairs 26A and 26B are disposed opposite to each other with a gap g (>d) across the optical axis of the ion beam 3. Each of the pole pieces 26a to 26d is wound with an internal coil 29, and the pole-piece pairs 26A and 26B are each wound with an external coil 30 in such a manner as to surround the internal coils 29.

16 Claims, 12 Drawing Sheets

DISTANCE FROM SAMPLE ON THE ION OPTICAL AXIS(mm)

DISTANCE FROM SAMPLE ON THE ION OPTICAL AXIS(mm)

FOCUSED ION BEAM APPARATUS

BACKGROUND OF THE INVENTION

1. Field of the Invention

The present invention relates to a focused ion beam apparatus for processing and/or observing a sample by focusing an ion beam on the sample.

2. Background Art

Focused ion beam (FIB) apparatuses are currently commercially used for microfabrication of a sample or observation thereof based on the irradiation of the sample with a narrowly focused ion beam. An ion beam in the presence of a magnetic field on its optical axis is deflected by the Lorentz force. Since the accelerating voltage of an FIB apparatus is normally on the order of several 10 kV, the beam spot could be in some cases displaced by several dozen μm or more even by the earth magnetism. Ga, which is conventionally used as an ion species, has two isotopes $^{69}$Ga and $^{71}$Ga, which have different degrees of deflection by the magnetic field. As a result, the Ga ion beam can in some cases separate into two beams. The beam also separates when the ion forms a cluster. If the beam spot has a displacement on the order of several dozen μm, the distance between the two, separated isotope ion beams could be on the order of 1 μm, depending on the difference in their mass/charge ratios. Such phenomenon must be avoided or suppressed in FIB apparatuses, which are used for microfabrication on the order of nanometers.

One of the simplest methods of eliminating a magnetic field on the optical axis is to magnetically shield the ion beam column with a magnetic body, and such method has conventionally been used. Patent Document 1 discloses a technique to provide even the tip portion of an FIB apparatus with magnetic shield.

However, it is difficult to provide a complete magnetic shield close to the sample. While a virtually complete magnetic shield could be provided by covering the entire apparatus, including the sample, with a magnetic shield, it is practically impossible to produce a magnetic shield with a completely shielded structure. In practice, the magnetic shield needs to be provided with openings, through which entry of magnetic field cannot be avoided. A typical FIB apparatus comprises an electrostatic deflector for irradiating a desired position of the sample with an ion beam. While this can be used to correct the displacement in the ion beam spot on the sample due to a magnetic field, it cannot prevent isotopes separation simultaneously.

Patent Document 3 discloses a means to actively deflect an ion beam using a Wien filter. This means, however, is used rather for actively separating the isotopes so as to cause unwanted isotope components to collide against a wall to eliminate them. Thus, the ion beam emitting opening is made very narrow, through which it is difficult to pass the ion beam in the presence of an external magnetic field. Thus, there is a need for the development of a technology to prevent the displacement of the ion beam spot and the separation of isotopes even when there is a magnetic field on the ion beam optical axis.

This is more important in the case of an FIB-SEM which combines an FIB column and an SEM column. The FIB-SEM is a recently commercialized apparatus that combines an observation SEM (Scanning Electron Microscope) and an FIB apparatus so as to allow the observation of a sample processed by the FIB apparatus at higher resolutions. Objective lenses in an SEM normally comprise electromagnets. In order to obtain higher resolutions, it is necessary to use a lens of the so-called semi-in lens type or the snorkel type, which produce a leakage of magnetic field toward the sample. Such magnetic field enters and reaches the FIB optical axis and therefore strongly deflects the ion beam, whereby, when the ion beam comprises beams having a plurality of mass/charge ratios, the ion beams are separated. Since the ion beam needs to be irradiated onto the sample located near the SEM objective lens, the optical axis of the ion beam cannot be sufficiently magnetically shielded. Further, placing the magnetic shield near the SEM objective lens disturbs the magnetic field of the SEM objective lens, thereby adversely affecting the resolution of the SEM.

When using the FIB-SEM that uses an SEM of the type that produces a leakage of magnetic field near the sample, a method is employed whereby, during microfabrication of the sample by the FIB apparatus, the magnetic field for the SEM objective lens is terminated, and the FIB is terminated while the sample is observed by the SEM. However, even when the exciting current to the SEM objective lens is terminated, the magnetic field remains and varies with time, producing a shift in the ion beam spot with time. Patent Document 2 discloses a technique to prevent this, which places a degaussing coil for eliminating the remaining magnetic field near the SEM objective lens. However, this technique requires degaussing the SEM objective lens whenever the SEM is switched to the FIB apparatus and is thus bothersome.

When the sample is microfabricated by the FIB apparatus while at the same time the sample is observed with the SEM, the out lens type, which does not produce a leakage magnetic field, has conventionally been used as the SEM objective lens. However, there is a growing need for higher SEM resolutions, and the use of the semi-in lens type of objective lens is becoming unavoidable. Thus, there is a need for a technology to realize an FIB apparatus and an FIB-SEM in which the ion beam does not develop the separation of isotopes, nor does the position of the ion beam spot on the sample change, even in the presence of a magnetic field on the optical axis of the ion beam or a fluctuation of the magnetic field.

To address these needs, Patent Document 4 discloses a technique to configure an optical system. The technique involves producing a corrective magnetic field on the optical axis of the ion beam. The corrective magnetic field causes a deflection by which the deflection of the ion beam due to an external magnetic field on the optical axis or a leakage magnetic field from the SEM objective lens can be cancelled, so that the beam spot position on the sample can coincide with the spot position in the case of absence of the magnetic field. In this configuration, even when the ion beam comprises a plurality of isotopes, with their different optical paths introduced by separation, the ion beams of all of the isotopes are focused back at one point on the sample in terms of the beam spot position.

Patent Document 1: JP Patent Publication (Kokai) No. 11-329318 A

Patent Document 2: JP Patent Publication (Kokai) No. 11-329320 A

Patent Document 3: JP Patent Publication Kokai) No. 7-296756 A

Patent Document 4: JP Patent Publication (Kokai) No. 2006-40809 A

SUMMARY OF THE INVENTION

However, since the processing accuracy of the FIB apparatus is on the order of nanometers, the requirement concerning the spatial uniformity of the corrective magnetic field is extremely strict. In order to focus the ion beam sufficiently narrowly on the sample, it is necessary to produce a corrective magnetic field that is sufficiently uniform over a larger area than the beam size at the position of the corrective magnetic field. However, it has been found that with the simple structure of the corrective magnetic field generating portion of Patent Document 4, where a magnetic field is produced between opposed pole pieces, a corrective magnetic field with high accuracy that can cancel out the external magnetic field cannot necessarily be produced. Possible causes for this include the mounting or manufacturing error of the apparatus, and influences of magnetic field from other apparatuses (including the SEM in the case of an FIB-SEM) or the earth magnetism, for example. Thus, there is a need for a new technology for producing a more uniform corrective magnetic field.

It is an object of the invention to provide a focused ion beam apparatus capable of accurately focusing an ion beam on the sample at the beam spot position of the case of the absence of magnetic field, without causing the isotope separation of the ion beam, even when there is a magnetic field on the ion beam optical axis or when the magnetic field fluctuates.

In order to achieve the aforementioned object, in accordance with the invention, an optical system is configured such that there is a region on the optical axis of the ion beam in which there are magnetic field components perpendicular to the optical axis that are directed opposite to each other, so that the beam spot position on the sample coincides with the spot position of the case of the absence of magnetic field. In this way, even when the ion beam contains a plurality of isotopes, with the resultant different optical paths due to their separation, the ion beams of all of the isotopes are focused back at one point at the beam spot position.

Particularly, in the case of an FIB-SEM, where the main source of magnetic fields is an objective lens of the SEM, there exists a strong magnetic field that is directed downward (or upward) in a narrow region near the optical axis of the SEM, while there is a weak magnetic field directed upward (or downward) in a wide region outside the objective lens. By configuring the ion beam optical system such that the beam penetrates these two regions with appropriate proportions, the aforementioned effects can be obtained.

In order to fine-adjust the ion beam spot position, preferably a corrective magnetic field generating unit is provided on the optical axis of the ion beam so as to actively generate a desired magnetic field. By malting the magnitude of the corrective magnetic field proportional to the external magnetic field (including the magnetic field from the SEM objective lens in the case of an FIB-SEM), the above effects can be maintained at all times even when the external magnetic field fluctuates.

The corrective magnetic field needs to be highly uniform in a space larger than the diameter of the ion beam. To this end, it is effective to divide each of opposed pole pieces in two and appropriately set their gap.

Effects of the Invention

In accordance with the invention, even when there is a magnetic field on the ion beam optical axis, or when the magnetic field fluctuates, it becomes possible to focus the ion beam at the beam spot position of the case of the absence of magnetic field without causing the separation of isotopes on the sample.

DESCRIPTION OF THE PREFERRED EMBODIMENTS

In the following, the invention is described by way of embodiments thereof with reference made to the drawings.

The present invention is directed to a focused ion beam apparatus for processing and/or observing a sample by focusing an ion beam on the sample. The invention can be applied to an FIB apparatus used for sample observation, an FIB apparatus used for sample processing, and an FIB apparatus used for both observation and processing.

First Embodiment

Figure 1:
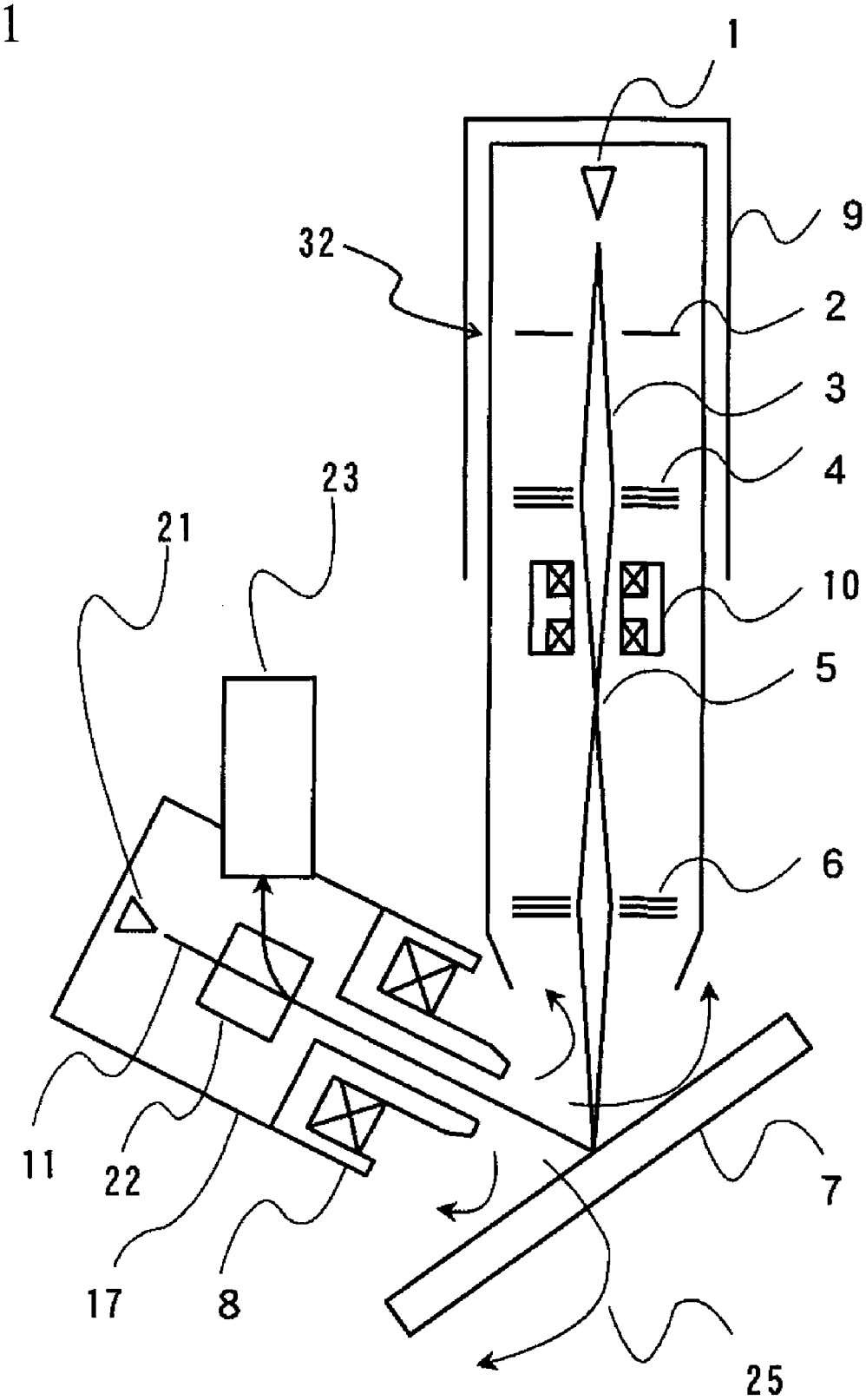
FIG. 1 shows a diagram for the description of an optical system according to a first embodiment of the invention.

FIG. 1 schematically shows an overall view of a focused ion beam apparatus (to be hereafter referred to as an FIB apparatus) according to a first embodiment of the invention.

The focused ion beam apparatus of the present embodiment comprises an ion source 1, an ion beam optical system 32, and an SEM 17, which are disposed in the same sample chamber. The ion beam optical system 32 includes an accelerating electrode 2, an electrostatic condenser lens 4, and an electrostatic objective lens 6.

A Ga ion emitted by a Ga liquid metal ion source 1 is accelerated by an electric field produced by an accelerating electrode 2, into a Ga ion beam 3 having a kinetic energy of 30 keV The ion beam is then focused by the electrostatic condenser lens 4 once into a crossover 5 (or focused without any crossover and with little change in the beam size), and is further focused on a sample by the electrostatic objective lens 6. The Ga ion beam 3 consists of two isotopes $^{69}$Ga and $^{71}$Ga, with the ratio of the content of $^{69}$Ga to $^{71}$Ga being approximately 6:4.

While it is possible to observe an SIM image of the sample 7 by detecting secondary electrons emitted by the sample 7 upon ion beam irradiation with a detector (not shown), the SEM 17 is used when an image of the sample 7 is to be observed with higher resolution than an SIM image.

An electron beam 11 produced by a cathode 21 in the SEM 17 passes through an electron optical system including an accelerating electrode and a condenser lens, which are not shown, and is then focused by an objective lens 8 on the sample 7. Secondary electrons emitted by the surface of the sample 7 travel near the optical axis of the electron beam 11 of the SEM 17, and then become incident on the E×B 22. The electrons are deflected by a magnetic field and an electric field of the E×B 22 and then detected by a secondary electrons detector 23. The electric field and the magnetic field of the E×B 22 are adjusted such that they cancel out their respective effects so as not to affect the electron beam 11 from the cathode 21.

The optical axis of the ion beam 3 and the optical axis of the electron beam 11 of the SEM 17 intersect at a substantially single point on the sample 7, allowing the microfabrication of the sample 7 with the ion beam 3 while simultaneously a processed region is observed by the SEM 17. It should be noted, however, that the "substantially single point" herein means that the spot of the ion beam 3 on the sample 7 is close enough to be included in the field of view of the SEM 17, i.e., the area scanned with the electron beam 11. Such area is on the order of 1 μm, for example, when an SEM observation is performed at high resolution. Namely, the beam spot of the ion beam 3 and the beam spot of the electron beam 11 are approximate to each other to such an extent that they can interfere with each other on the sample 7.

The objective lens 8 of the SEM 17 is of the so-called semi-in lens type or the snorkel type by which, in order to bring the lens principal plane close to the sample 7 and achieve high resolution, the magnetic field (of which the magnetic field lines are indicated by numeral 25) is actively caused to be distributed toward the sample 7. Thus, on the optical axis of the ion beam 3, the magnetic field produced by the objective lens 8 of the SEM 17 is distributed. However, the objective lens 8 may be replaced with an out lens type without any problems.

Figure 2:
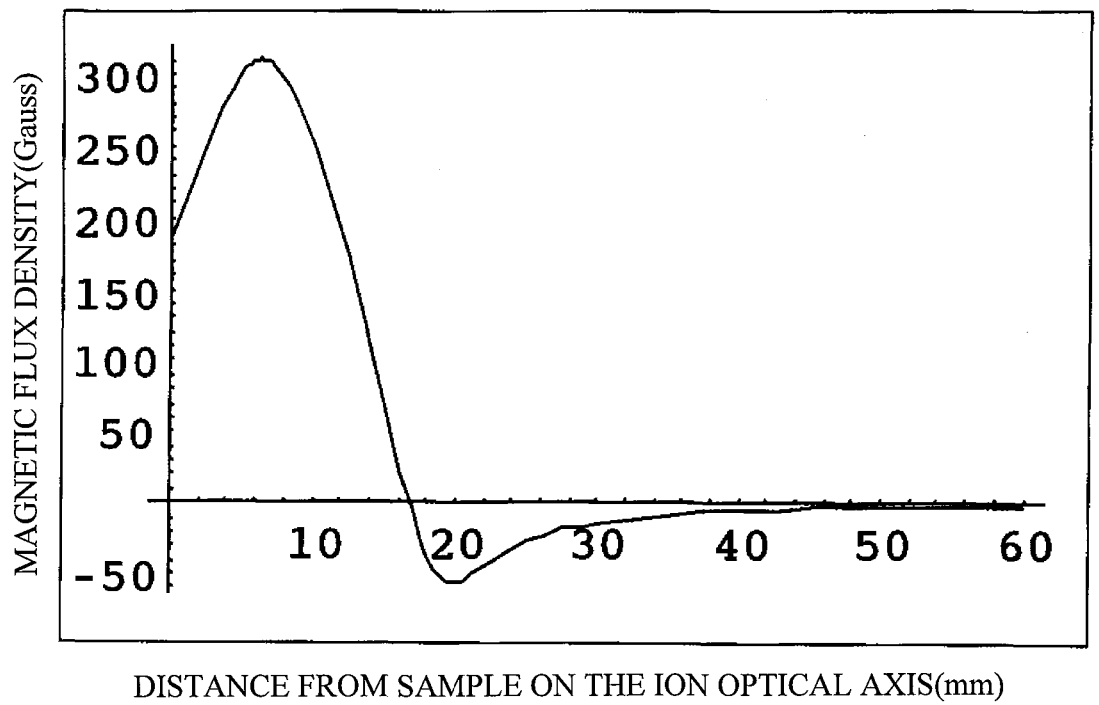
FIG. 2 plots a magnetic field on the ion beam optical axis in the first embodiment of the invention.

Of the magnetic field generated by the objective lens 8 of the semi-in lens type or the snorkel type, those components perpendicular to the optical axis of the ion beam 3 deflect the ion beam 3 by the Lorentz force. Such magnetic field components are oppositely directed in a region near the objective lens 8 of the SEM 17 and in other regions, as shown in FIG. 2. The horizontal axis of FIG. 2 shows the coordinate on the ion beam optical axis, with the ion beam spot position on the sample 7 (i.e., the position of sample 7) as the origin.

Since the portion of the ion beam optical system 32 closer to the ion source 1 is covered with a magnetic shield 9, there is hardly any magnetic field. Once the ion beam 3 enters a region not covered with the magnetic shield 9, it is affected by a magnetic field. As a result, the ion beam is deflected by the Lorentz force in a direction perpendicular to the sheet of FIG. 1 (such as away from the viewer). As the beam further travels and comes near the objective lens 8 of the SEM 17, it feels an opposite magnetic field as shown in FIG. 2, so that it is deflected by the Lorentz force of the opposite direction before it reaches the surface of the sample 7. While the ion beam spot position in this case is close to the position of the case of the absence of magnetic field, it is difficult to make them perfectly coincident with each other.

Figure 3:
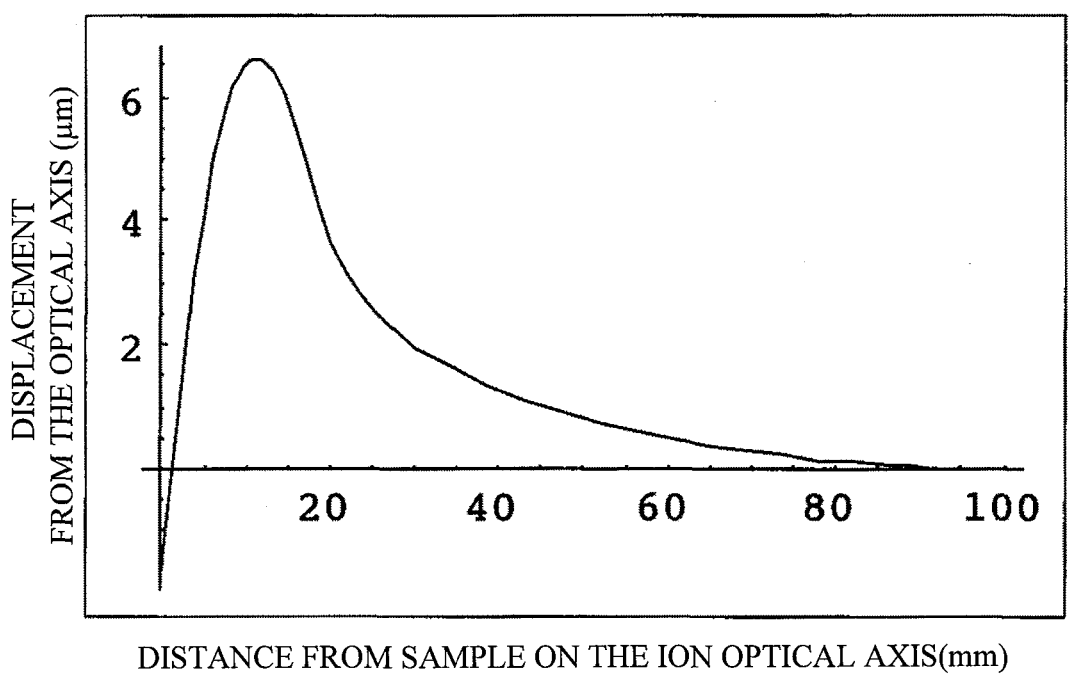
FIG. 3 plots an ion beam path in the first embodiment of the invention.

A region 32 of the ion beam optical system that is covered with the magnetic shield 9 is determined such that the ion beam spot is as close as possible to the position of the case of the absence of magnetic field. FIG. 3 shows the path of the ion beam in the case of FIG. 2 where there is the influence of a magnetic field.

Hereunder, the aforementioned displacement of the ion beam spot on the sample as a result of the deflection of the ion beam by the magnetic field is expressed by mathematical expressions.

An equation of motion of an ion can be expressed as follows (Equation 1):

$$\frac{d^2 \vec{r}}{dt^2} = \frac{q}{m}(\vec{v} \times \vec{B}(\vec{r}) + \vec{E}(\vec{r})) \quad \text{(Equation 1)}$$

where $\vec{r}$ is the position vector of the ion, $\vec{v}$ is the velocity vector of the ion, $\vec{B}(\vec{r})$ and $\vec{E}(\vec{r})$ are the magnetic field vector and the electric field vector, respectively, at $\vec{r}$, m is the mass of ion, q is the charge of ion, and t is time. The coordinate system used herein is a right-handed system, where, with respect to the position of beam spot on the sample in the case of the absence of magnetic field as the origin, the ion beam optical axis is in the z direction, the direction perpendicular to the magnetic field, i.e., the direction in which the beam is deflected, is in the x direction, and the direction of magnetic field on the optical axis is in the y-z plane.

$\vec{E}(\vec{r})$ in Equation (1) corresponds to the electric field of the objective lens 6 of the ion beam optical system. Disregarding vx and vy as they are very small compared with the velocity vz in the direction of optical axis, rewriting Equation 1 with respect to x component yields the following:

$$\frac{d^2 x}{dt^2} = \frac{e}{m}(B_y(z)v_z(z) + E_x(z)) \quad \text{(Equation 2)}$$

The y direction is omitted because there is either no or little difference from the case of the absence of magnetic field. With regard to the z direction, it is useful to use the following equation, which is equivalent to an equation of motion. This means the energy conservation law:

$$v_z(z) = \sqrt{\frac{2e(V_{acc} - \phi(z))}{m}} \quad \text{(Equation 3)}$$

where Vacc is the accelerating voltage, and $\phi(z)$ is potential at z.

Modifying the left side of Equation 2 yields the following:

$$\frac{d^2 t}{dt^2} = \frac{dz}{dt}\frac{d}{dz}\left(\frac{dz}{dt}\frac{dx}{dt}\right) \quad \text{(Equation 4)}$$

$$= v(z)\frac{d}{dz}\left(v(z)\frac{dx}{dz}\right)$$

Substituting Equations 4 and 3 into Equation 2 and integrating it yields displacement Δx of the beam spot on the sample. The distance between the point of emergence of ion beam and the sample is assumed to be L. The point of emergence may be anywhere on the optical axis as long as it is located where it is not affected by magnetic field.

$$\Delta x = \frac{e}{m} \int_L^0 \frac{dz_1}{v(z_1)} \int_L^{z_1} \frac{B_y(z)v_z(z) + E_x(z)}{v(z)} dz \quad \text{(Equation 5)}$$

$$= \frac{e}{m} \int_L^0 \sqrt{\frac{m}{2e(V_{acc} - \phi(z_1))}} dz_1$$

$$\int_L^{z_1} \left( B_y(z) + E_x(z) \sqrt{\frac{m}{2e(V_{acc} - \phi(z))}} \right) dz$$

$$= \frac{e}{\sqrt{m}} \int_L^0 \frac{dz_1}{\sqrt{2e(V_{acc} - \phi(z_1))}} \int_L^{z_1} B_y(z) dz +$$

$$\frac{1}{2} \int_L^0 \frac{1}{\sqrt{2e(V_{acc} - \phi(z_1))}} dz_1 \int_L^{z_1} \left( \frac{E_x(z)}{\sqrt{(V_{acc} - \phi(z))}} \right) dz$$

In Equation 5, the second term contains neither the mass of ion nor any magnetic field. Namely, it corresponds to the beam when there is no magnetic field, thus indicating the displacement due to the FIB objective lens. Since Ex is also zero with respect to the beam passing along the optical axis, the beam passes through the point of origin. The first term is dependent on the magnetic field. Since this term is inversely proportional to $\sqrt{m}$, it corresponds to the isotope separation due to the magnetic field. When the mass difference in isotopes is Δm, the width δ of separation of isotopes is given by $$\frac{\Delta x}{2} \frac{\Delta m}{m} \quad \text{(Equation 6)}$$

The position of the end surface of the magnetic shield 9 toward the sample is determined such that it corresponds to such an L that the first term of Equation 5 can be minimized as much as possible.

It is always possible to adjust magnetic field By(z) by superposing an appropriate corrective magnetic field on the leakage magnetic field from the objective lens 8 of SEM 17 so that the integration of the first term becomes completely zero. By producing such corrective magnetic field on the ion beam optical axis so as to eliminate the first term of Equation 5, the influence of magnetic field can be completely eliminated within the range of first approximation with respect to the beam spot position on the sample 7; namely, Equation 5 indicates that the beam deflection and isotope separation by magnetic field can be simultaneously cancelled out.

In the present embodiment, which is based on the above understanding, in order to make the ion beam spot position completely coincide with the position of the case of the absence of magnetic field, a corrective magnetic field generating unit 10 is disposed on the optical axis of the ion beam 3. The corrective magnetic field generating unit 10 generates a corrective magnetic field for correcting the deflection of ion beam 3 due to the influence of a magnetic field from outside the focusing ion beam optical system 32. The corrective magnetic field generating unit 10 is disposed downstream (downwardly) of the electrostatic condenser lens 4 in the direction of travel of the beam.

Before describing the structure of the corrective magnetic field generating unit 10 in the present embodiment, the structure of a corrective magnetic field generating unit 10' as a comparative example is described.

Figure 4:
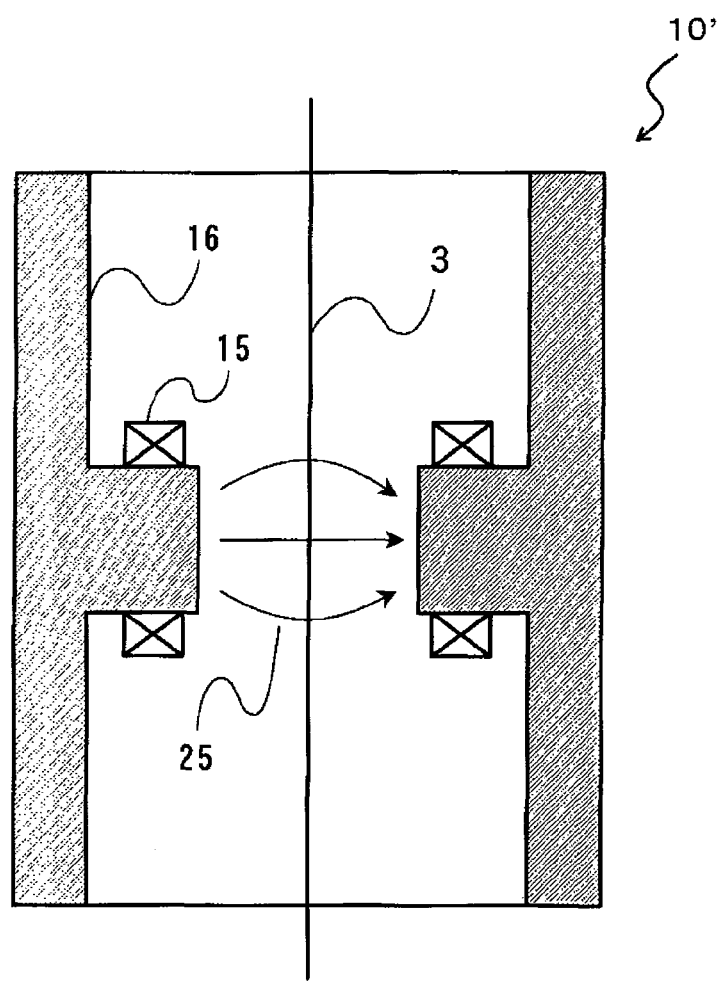
FIG. 4A shows a cross section of a corrective magnetic field generating unit in the first embodiment of the invention.
FIG. 4B shows a top plan view of the corrective magnetic field generating unit of the first embodiment.
Figure 4:
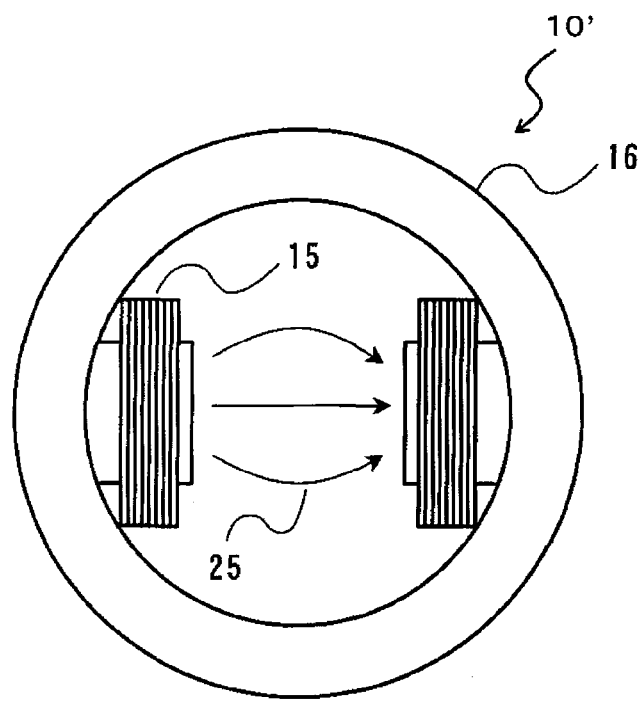

The corrective magnetic field generating unit 10' of the comparative example comprises a pair of opposed coils 15 and a yoke 16 made of pure iron, as shown in FIGS. 4A and 4B. FIG. 4A is an enlarged view of the corrective magnetic field generating unit 10' as seen from the same direction as FIG. 1; FIG. 4B is a top view thereof.

In FIGS. 4A and 4B, the yoke 16 produces a corrective magnetic field (indicated by magnetic field lines 25) on the optical axis of the ion beam 3, while it functions as a magnetic shield to restrict the leakage magnetic field from the coil 15 to the outside. The material of the yoke 31 is not limited to pure iron; it may be any magnetic material having large magnetic permeability and small coercivity, such as permalloy or permendur. The greater the magnetic permeability, the more the leakage magnetic field to the outside can be reduced.

When the focused ion beam apparatus of the present embodiment is provided with the corrective magnetic field generating unit 10' instead of the corrective magnetic field generating apparatus 10, the direction of the magnetic field lines 25 of the corrective magnetic field produced by the corrective magnetic field generating apparatus 10' on the optical axis of the ion beam 3 is parallel to the plane of the sheet of FIGS. 1 and 4A and perpendicular to the ion beam optical axis. In this way, the ion beam 3 is subjected to the Lorentz force in a direction perpendicular to the sheet of the drawings and the optical axis. Since such direction is parallel to the Lorentz force by the magnetic field from the objective lens 8 of the SEM 17, it is possible, theoretically, to make the position of the ion beam spot on the sample 7 completely coincide with the position of the case of the absence of magnetic field, by adjusting the direction and magnitude of the corrective magnetic field. Mathematically, this is synonymous to making the first term of Equation 5 zero.

However, the processing accuracy required of an FIB apparatus is on the order of nanometers. Therefore, in order to make the position of the ion beam spot completely coincide with the position of the case of the absence of magnetic field, the corrective magnetic field must have an extremely high spatial uniformity. Thus, with the corrective magnetic field generating unit 10' of the comparative example having a simple structure, it is not necessarily possible to sufficiently cancel out the leakage magnetic field from the outside in the event that the direction of the corrective magnetic field is even slightly displaced by the mounting error or manufacturing error of the corrective magnetic field generating unit 10', or when the influence of the earth magnetism cannot be disregarded, for example. The same is also true when the direction of the external magnetic field is displaced by the mounting or manufacturing error of the SEM 17.

Such technical problems can be solved by the corrective magnetic field generating unit 10 of the present embodiment, whereby the direction of the corrective magnetic field can be fine-adjusted as needed and the spatial uniformity of the corrective magnetic field can be further improved.

Figure 5:
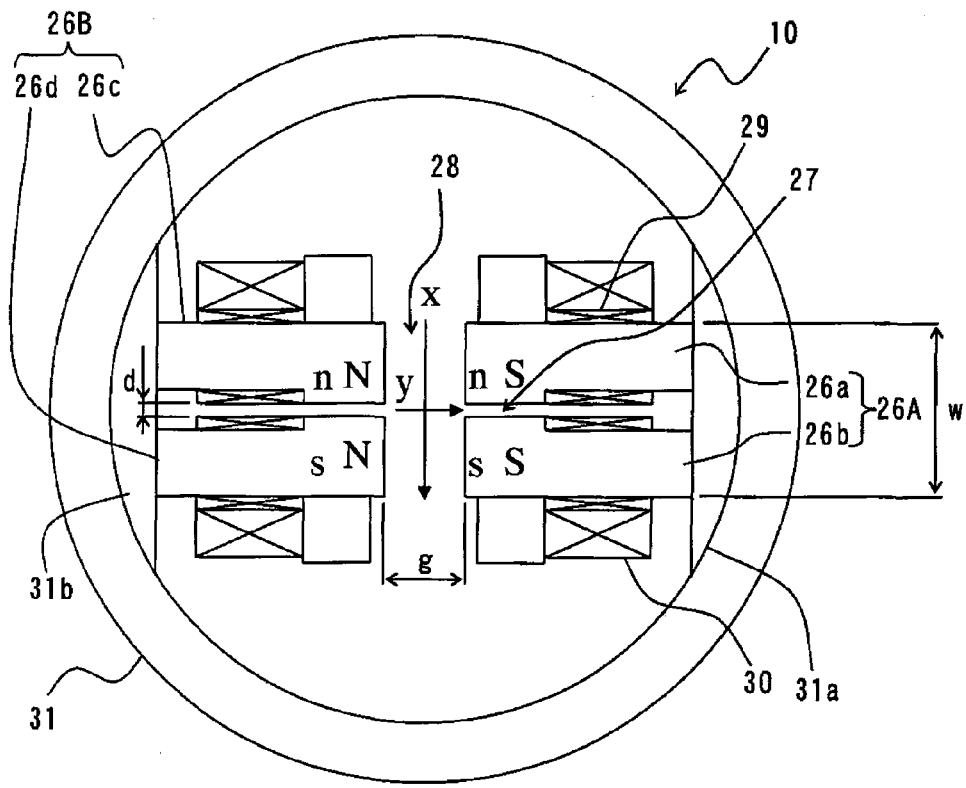
FIG. 5 shows a top plan view for the description of the structure of the corrective magnetic field generating unit according to a fifth embodiment of the invention.

FIG. 5 shows a top-plan view of the corrective magnetic field generating unit 10 of the invention, as seen from the same direction as FIG. 4B. The external magnetic field to be corrected or the leakage magnetic field from the objective lens 8 of the SEM 17 is assumed to be parallel to the y direction.

The corrective magnetic field generating unit 10 includes a total of four pole pieces 26a to 26d, of which two adjacent pole pieces 26a and 26b are disposed side by side along the x axis direction with a gap d, thereby forming a single pole-piece pair 26A. The pole pieces 26a and 26b, which are fixed in a posture along the y axis, are positioned parallel to each other. Similarly, the other two adjacent pole pieces 26c and 26d are disposed side by side with a gap d therebetween along the x axis, forming a single pole-piece pair 26B. These pole pieces 26c and 26d are also fixed in a posture along the y axis and are positioned parallel to each other. The pole-piece pairs 26A and 26B are disposed opposite each other along the x axis and the y axis, which is perpendicular to the ion beam optical axis, with a gap g greater than d (>d), across the ion beam optical axis.

From a different perspective, the pole-piece pairs 26A and 26B can be each regarded as a single pole piece; thus, in the present embodiment, each such pole piece can be considered to be divided in two. Thus, the narrower gap d will be referred to as an intra-pole gap 27, and the wider gap g will be referred to as an interpole gap 28. Between these gaps 27 and 28, an insulator or a nonmagnetic metal may be disposed as a spacer, whereby the distance between the pole pieces can be accurately defined.

Each of the pole pieces 26a to 26d is wound with an internal coil 29 having the same number of windings. The four internal coils 29 are connected in series and excited with the same intensity. As the internal coils 29 are excited, the two pole pieces 26a and 26c at the top of FIG. 5 both equally assume N poles, while the two pole pieces 26b and 26d at the bottom both equally assume S poles. Thus, an x-axis-direction magnetic field can be produced by the internal coils 29, as shown in FIG. 5, where the polarity of each pole piece is indicated by a lower-case letter of the alphabet. When the pole pieces 26a and 26c are made S poles, the pole pieces 26b and 26d assume N poles.

The pole-piece pair 26A is wound with an external coil 30 such that the external coil 30 wraps the two internal coils 29, with the two pole pieces 26a and 26b of the pole-piece pair forming a single core. Similarly, the other pole-piece pair 26B is also wound with an external coil 30. The two external coils 30 have the same number of windings and are connected in series. They have opposite polarities to each other; when the pole-piece pair 26B is N pole, the pole-piece pair 26A is S pole. Thus, a magnetic field in the y axis direction can be produced by the external coils 30, as shown in FIG. 5, where the polarity of each pole piece is indicated by an upper-case letter of the alphabet. When the pole-piece pair 26B is made S pole, the pole-piece pair 26A assumes N pole.

These pole pieces 26a to 26d are fixed to a ring-shaped yoke 31, which is cylindrical in shape. All of the ion beam 3 passes through the opening of the yoke 31 (specifically, the interpole gap 28 between the pole-piece pairs 26A and 26B). Thus, the ion beam 3 does not interfere with the yoke 31, the individual pole pieces 26a to 26d, or the coils 29 or 30. On the internal circumferential portion of the yoke 31, two mutually opposed mount seats 31a and 31b are provided. The seating surfaces of the mount seats 31a and 31b are formed in parallel to each other within such a range as to permit mounting or manufacturing errors. The root portions of the pole pieces 26a and 26b of the pole-piece pair 26A are fixed to the mount seat 31a, while the root portions of the pole pieces 26c and 26d of the pole-piece pair 26B are fixed to the mount seat 31b. The material and function of the yoke 31 are the same as those of the yoke 16: it confines the magnetic field generated by the corrective magnetic field generating unit 10 within the corrective magnetic field generating unit 10 effectively.

When the corrective magnetic field by the corrective magnetic field generating unit 10 and the external magnetic field (which, in the present example, is a magnetic field from the objective lens 8 of the SEM 17) are perfectly parallel to each other, it is possible to make the ion beam spot perfectly coincide with the spot of the case of no influence from the external magnetic field by exciting the external coils 30 alone without exciting the internal coils 29, and adjusting the exciting current so that the external magnetic field can be cancelled out by the corrective magnetic field.

Even when the corrective magnetic field and the external magnetic field are not perfectly parallel to each other due to the mounting or manufacturing errors in the components of SEM 17 or the ion beam column, both the x direction component and the y direction component of the external magnetic field can be cancelled out by the corrective magnetic field by exciting the internal coils 29 as well as the external coils 30 and adjusting the exciting currents to the coils 29 and 30. Thus, in the present example, even when the corrective magnetic field is not parallel with the external magnetic field, the ion beam spot can be made to coincide with the spot of the case of no influence of external magnetic field by producing a small magnetic field in the y direction.

Furthermore, since the corrective magnetic field generating unit 10 is positioned under the electrostatic condenser lens 4, it is possible to make the corrective magnetic field act on the narrow, focused ion beam. If the corrective magnetic field generating unit 10 were to be designed to produce a corrective magnetic field ion source 1 that acts on the ion beam immediately after it is emitted by the ion source 1, the corrective magnetic field would act on the thick ion beam that has yet to be focused. In this case, in order to cause the ion beam to be focused sufficiently narrowly on the sample, it would become necessary to produce a corrective magnetic field that is sufficiently uniform over an area larger than the beam diameter at the position of the corrective magnetic field. As a result, the region in which the corrective magnetic field must be uniform would be all the more extended, making it difficult to ensure a sufficiently uniform corrective magnetic field.

In contrast, in accordance with the present embodiment, since the corrective magnetic field is caused to act on the ion beam that has been focused, the area in which the corrective magnetic field needs to be uniform can be reduced, so that a sufficiently uniform corrective magnetic field can be ensured more reliably.

In the following, the dimensions of the gaps between the pole pieces and the like of the corrective magnetic field generating unit 10 are discussed.

For example, it is assumed that the diameter of the ion beam in the corrective magnetic field generating unit 10 is 0.5 mm. Since the corrective magnetic field must be uniform in at least the portion thereof in which the ion beam is covered, the area of uniform corrective magnetic field must be large enough to surround the ion beam; namely, it must be larger than the diameter of the ion beam. According to the present inventors' findings, in order to make the beam focused into a spot diameter on the sample surface on the order of nanometers, the value of uniformity of the corrective magnetic field needs to be $10^{-5}$ or smaller, where the uniformity is defined as the quotient of the difference between the maximum magnetic field, which passes through the origin on the x axis (ion beam optical axis), and the magnetic field that passes at the external diameter of the ion beam, divided by the maximum magnetic field.

Figure 6:
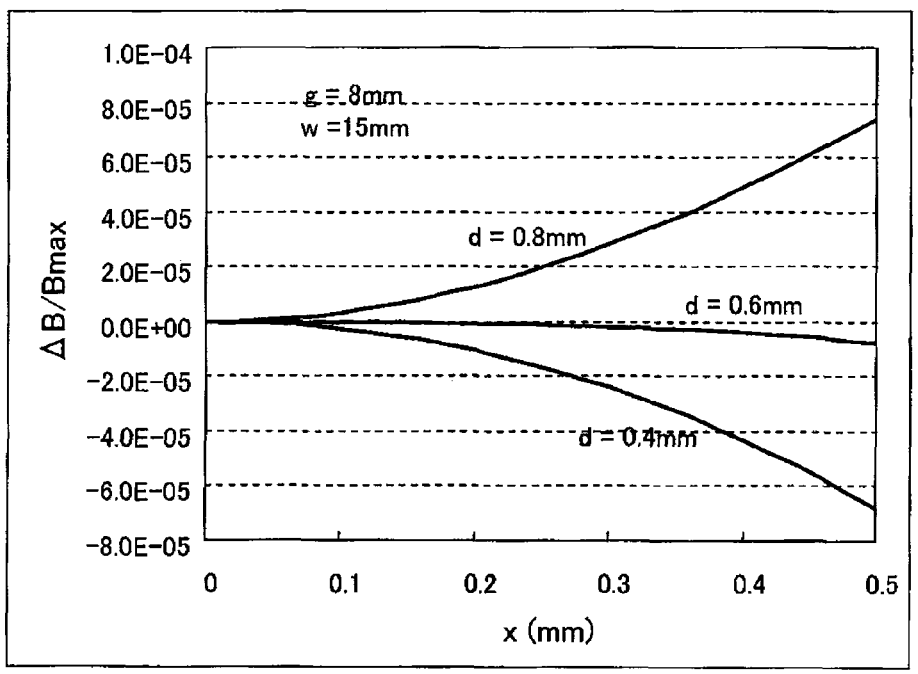
FIG. 6 shows the x dependency of relative values of the corrective magnetic field in a case where an intra-pole gap 27 in the corrective magnetic field generating unit of the fifth embodiment was varied.

FIG. 6 shows an x-coordinate dependency of relative values of the corrective magnetic field as the size d of the intra-pole gap 27 is varied from 0.4 mm, 0.6 mm, to 0.8 mm. In each case, the size g of the interpole gap 28 is 8 mm, and the pole width (width of the pole-piece pairs 26A and 26B), i.e., the width w of the two pole pieces 26 combined with the intra-pole gap 27 therebetween, is 15 mm. The origin of the x axis is assumed to be on the optical axis of the ion beam. The vertical axis of FIG. 6 shows the value of the difference, ΔB, between the y-axis-direction magnetic field at the x coordinate and the y-axis-direction maximum magnetic field Bmax at the origin, divided by Bmax. If the condition is that the value must be $10^{-5}$ or smaller in the range of x<0.5 mm, the condition is satisfied when the size d of the intra-pole gap 27 is 0.6 mm.

Figure 7:
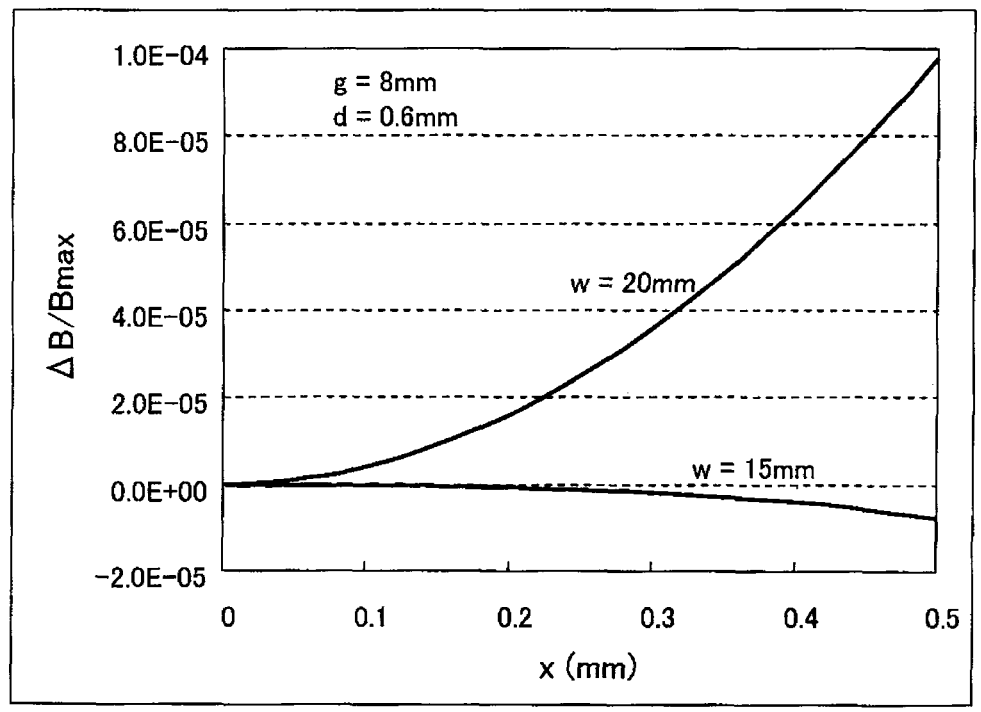
FIG. 7 shows the x dependency of relative values of the corrective magnetic field in a case where the pole width was varied in the corrective magnetic field generating unit of the fifth embodiment.

FIG. 7 shows the difference obtained as the pole width w was changed from 15 mm to 20 mm, with the size d of the intra-pole gap 27 fixed to 0.6 mm. The result showed that the condition was satisfied when the pole width w was 15 mm.

Figure 8:
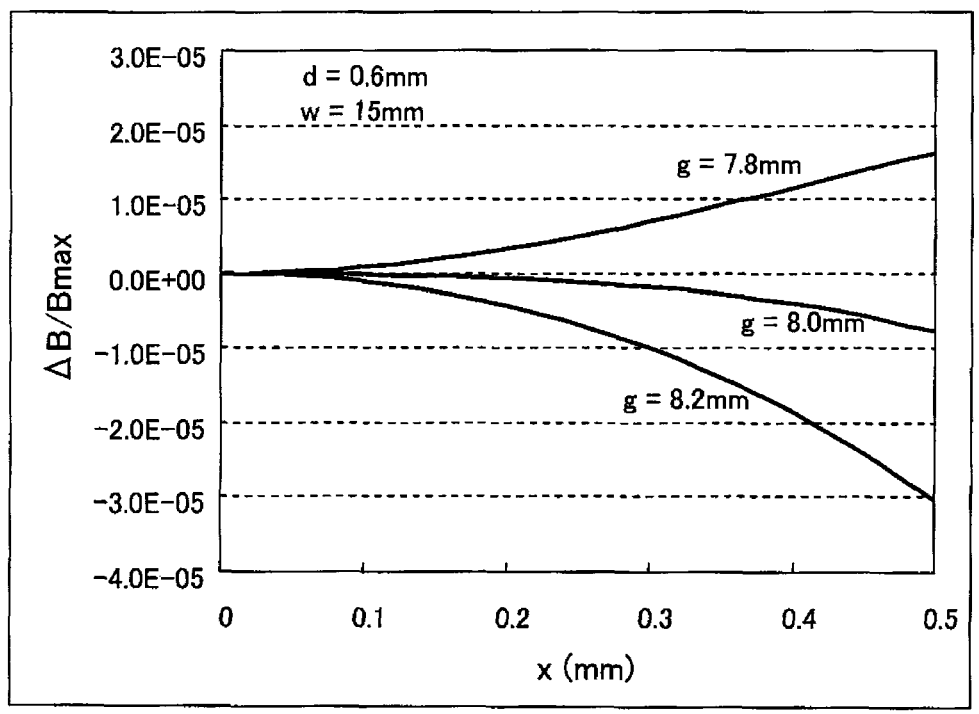
FIG. 8 shows the x dependency of relative values of the corrective magnetic field in a case where an interpole gap 28 was varied in the corrective magnetic field generating unit of the fifth embodiment.

FIG. 8 shows the difference obtained as the size g of the interpole gap 28 was changed from 7.8 mm, 8.0 mm, and to 8.2 mm, with the size d of the intra-pole gap 27 fixed to 0.6 mm and the pole width w fixed to 15 mm. As a result, it was shown that, under the condition assumed in the present example, the best characteristics were obtained when the intra-pole gap (d) was 0.6 mm, the interpole gap (g) was 8 mm, and the pole width (w) was 15 mm.

Figure 9:
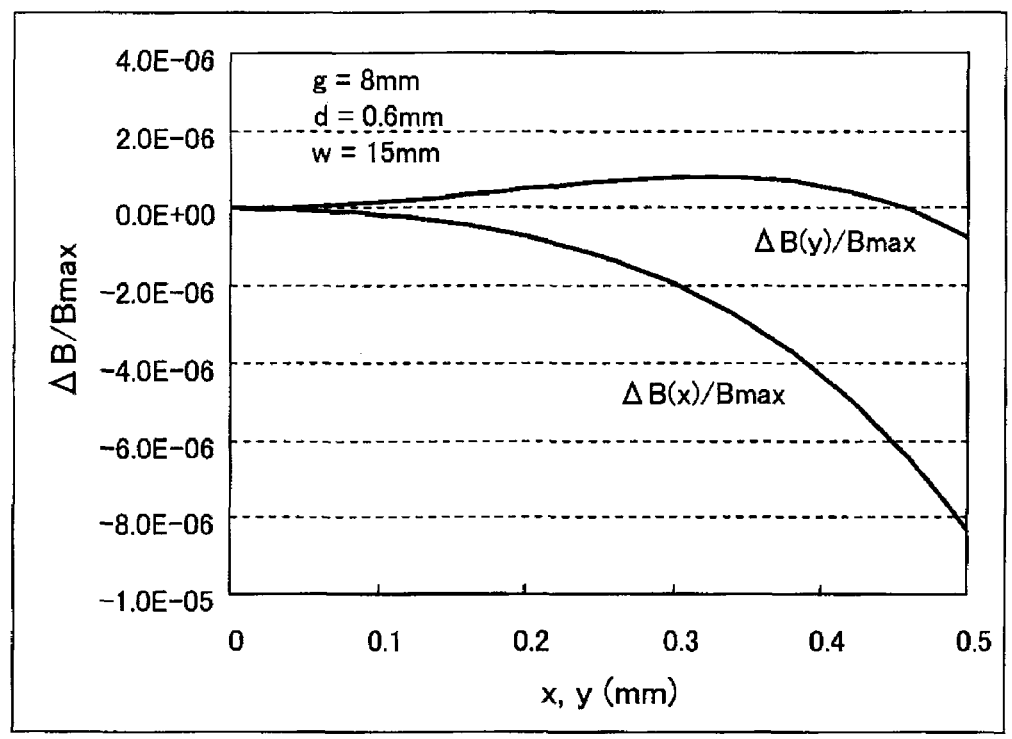
FIG. 9 shows the x dependency and the y dependency of relative values of the corrective magnetic field in the corrective magnetic field generating unit of the fifth embodiment.

FIG. 9 shows the y-coordinate dependency together with the x-coordinate dependency with respect to the case of best characteristics obtained in FIG. 8.

It can be seen from FIG. 9 that the uniformity of the magnetic field in the y axis direction is an order of magnitude higher than that in the x direction. Based on the foregoing, the corrective magnetic field generating unit of FIG. 5 was fabricated and good results were obtained in the present embodiment when the intra-pole gap was 0.6 mm, the interpole gap was 8 mm, and the pole width was 15 mm.

From FIGS. 6 to 8, an increase of 0.1 mm in the intra-pole gap 27 results in an increase of approximately $3 \times 10^{-5}$ in $\Delta B/B_{max}$. An increase of 0.1 mm in the pole width results in an increase of approximately $2 \times 10^{-5}$ in $\Delta B/B_{max}$. An increase of 0.1 mm in the interpole gap 28 results in a decrease of approximately $1 \times 10^{-5}$ in $\Delta B/B_{max}$. Thus, on the basis of the sizes of the present embodiment, the same level of uniformity as that of the present embodiment can be maintained by satisfying $$c = 3a + 2b \quad \text{(Equation 7)}$$

where a is the increment in size d of the intra-pole gap 27, b is the increment in the pole width w, and c is the increment in size g of the interpole gap 28.

Even if Equation 7 is not satisfied, it is still possible to calculate the same level of uniformity of magnetic field by means of the aforementioned x- or y-coordinate dependency relationship. Thus, in cases where the requirement concerning uniformity of magnetic field is lower than that of the present embodiment, allowable sizes can be re-calculated.

Figure 10:
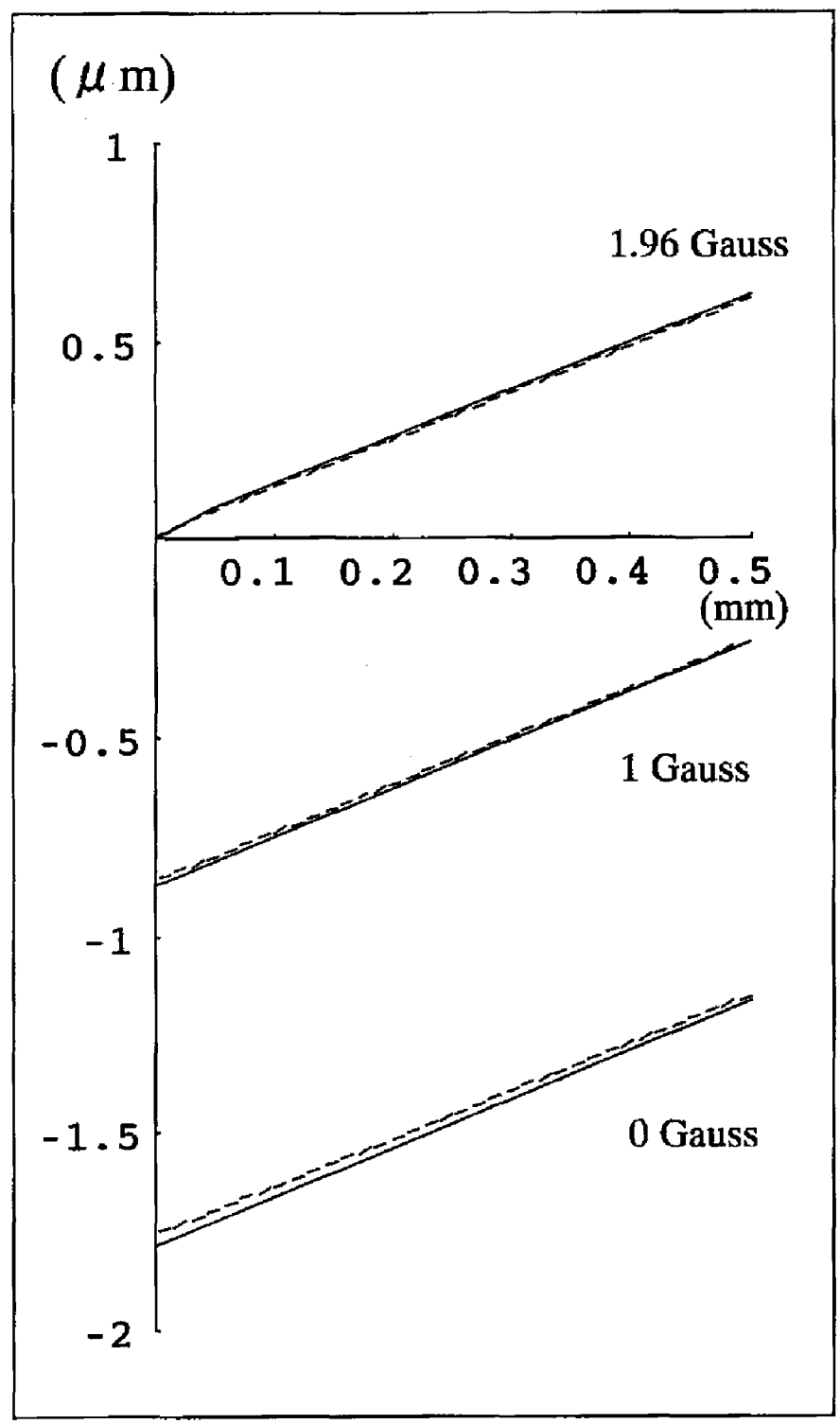
FIG. 10 plots ion beam paths near the sample in the first embodiment of the invention.

FIG. 10 shows the result of simulating the path of the Ga ion beam 3 near the sample when the corrective magnetic field was changed. The solid line shows the path of $^{69}Ga$, while the broken line shows the path of $^{71}Ga$. The vertical axis has the origin corresponding to the ion beam spot position in the absence of magnetic field.

In FIG. 10, when there is a magnetic field, the ion beam is separated depending on the mass/charge ratios of the ions, where the separation width on the sample is proportional to the amount of displacement of the ion beam spot on the sample from the origin. Thus, as will be seen from FIG. 10, the smaller the displacement of the ion beam spot from the origin, the smaller the separation width of the two isotopes becomes. In the case of the present embodiment, the ion beam passed through the origin and the isotope separation width became substantially zero when the magnetic flux density of the corrective magnetic field was 1.96 Gauss. In this case, the angle of incidence of the ion beam 3 to the sample 7 is about 1 mrad, and the maximum displacement of the ion beam 3 from the optical axis is not more than 6 µm. Thus, the ion beam passes through substantially the center of the ion beam optical system, and the influences of aberrations or the like of the ion beam optical system on performance can be disregarded.

Figure 11:
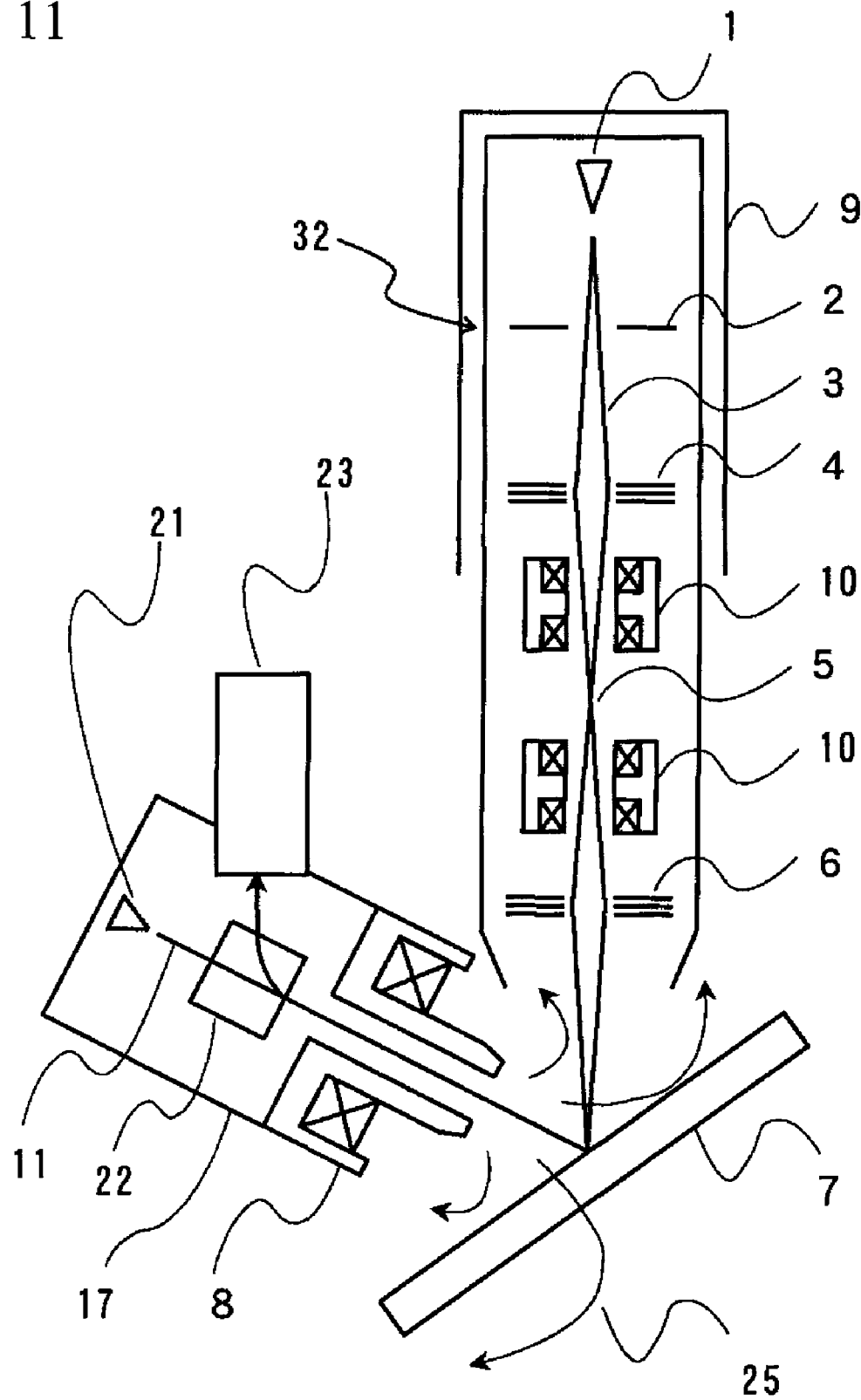
FIG. 11 shows a diagram for the description of an optical system in which two of the corrective magnetic field generating unit of the first embodiment of the invention are employed in a two-stage series configuration.

If the ion beam greatly diverges from the center of the objective lens 6, the resolution of the focusing ion beam deteriorates because the beam spot becomes larger due to the off-axis aberration of the objective lens 6. In such a case, another corrective magnetic field generating unit 10 may be provided additionally on the optical axis of the ion beam 3 toward the sample 7, to thus construct a two-stage series configuration, as shown in FIG. 11. In this way, the separation of the ion beam spot on the sample can be prevented, the beam spot can be made to coincide with the position of the case of the absence of magnetic field, and the ion beam 3 can be made to pass through the center of the objective lens 6.

Figure 12:
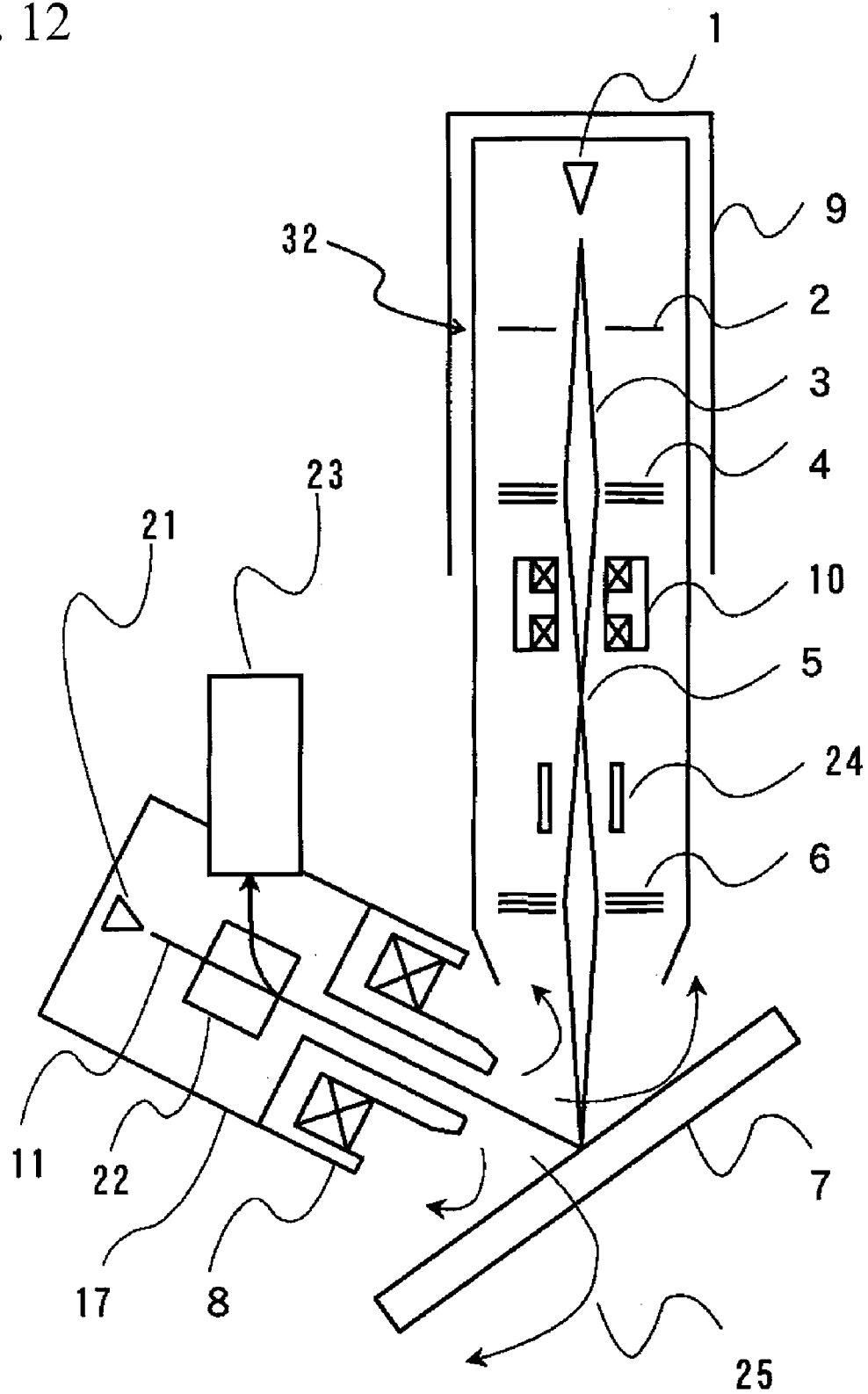
FIG. 12 shows a diagram for the description of an optical system based on the optical system of FIG. 1 of the first embodiment of the invention, to which an electrostatic deflector is added so as to cause the ion beam to pass through the center of the objective lens.

Alternatively, as shown in FIG. 12, the corrective magnetic field generating unit 10 may remain a single stage, and instead of the corrective magnetic field generating unit 10 additionally provided in FIG. 11, an electrostatic deflector 24 may be employed and adjusted such that the ion beam 3 passes through the center of the objective lens 6. Since the change in the ion beam path produced by the electrostatic deflector 24 is not dependent on the mass/charge ratios of the ion, the electrostatic deflector 24 does not cause a separation in the ion beam spot. Thus, in this case, too, the separation of the ion beam spot can be prevented and the ion beam 3 can be caused to pass through the center of the objective lens 6. In this case, however, the beam spot on the sample is displaced from the position of the case of the absence of magnetic field. In order to prevent the separation of the ion beam spot on the sample, to cause the beam spot to coincide with the position of the case of the absence of magnetic field, and to allow the ion beam 3 to pass through the center of the objective lens 6, two stages of the electrostatic deflectors 24 need to be provided in series.

The corrective magnetic field generating unit 10 may be located anywhere on the optical axis of the ion beam 3 to the extent that the uniformity of the corrective magnetic field can be ensured. Preferably, however, the corrective magnetic field generating unit 10 should be spaced apart from the sample 7 to such an extent that the magnetic field of the objective lens 8 of the SEM 17 is not disturbed. As an example, in the present embodiment, the corrective magnetic field generating unit 10 was installed 100 mm away from the beam spot position on the sample 7. The length of the region in which the corrective magnetic field is effective is on the order of 10 mm, for example.

Second Embodiment

Normally, excitation of the objective lens of the SEM needs to be frequently varied, as when the focal length is to be changed or when the accelerating voltage is to be changed. In response, the magnitude of the magnetic field that influences the ion beam optical axis also varies, whereby the ion beam spot on the sample 7 is displaced and, in proportion to the amount of such displacement, isotope separation is caused.

Figure 13:
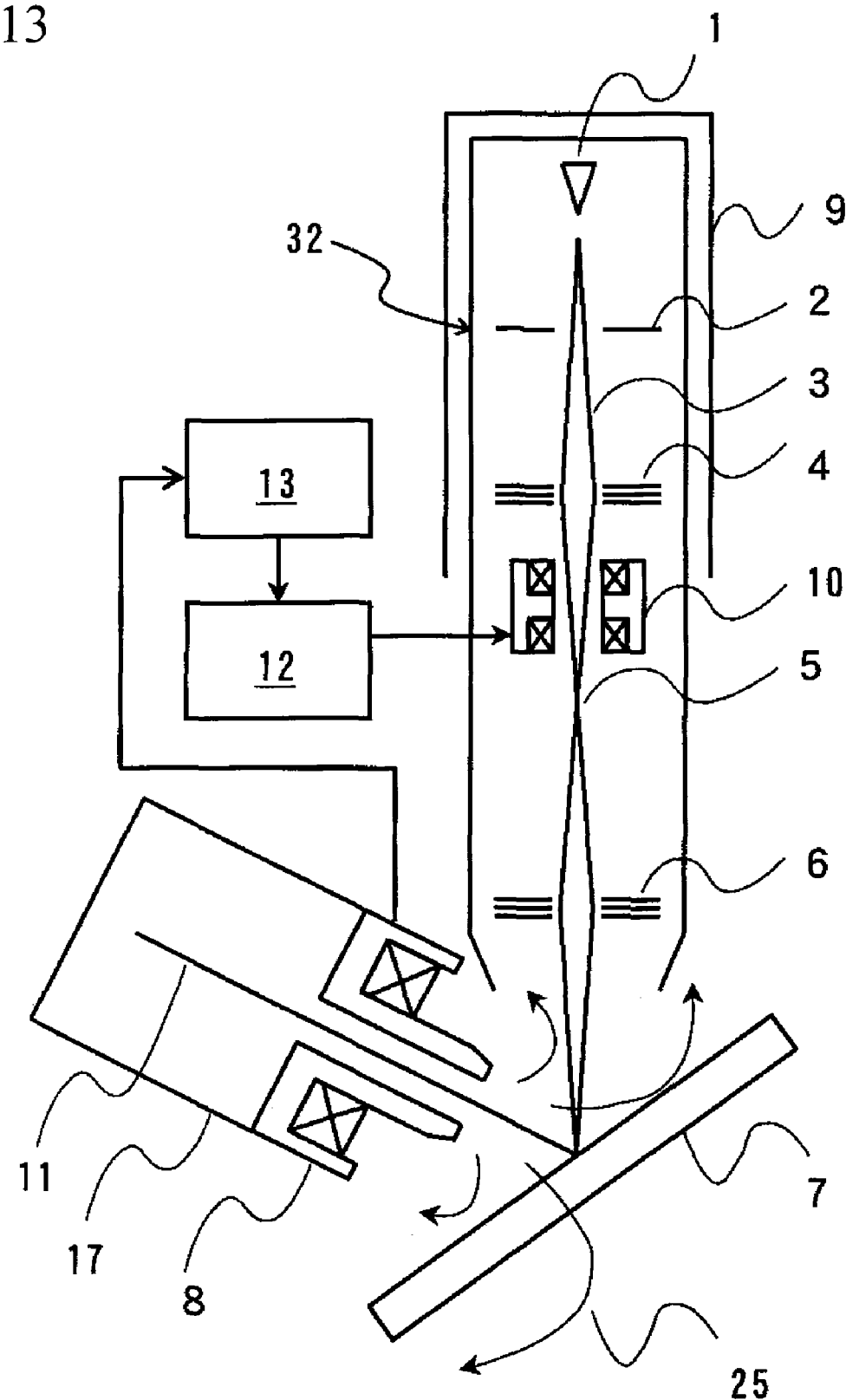
FIG. 13 shows a diagram for the description of an optical system according to a second embodiment of the invention.

In the present embodiment, in order to solve this problem, a corrective magnetic field control unit 12 is provided, as shown in FIG. 13. In FIG. 13, portions similar to those of the already-described drawings, or portions having functions similar to those of the already-described drawings, are designated with similar numerals and their descriptions are omitted.

The corrective magnetic field control unit 12 receives a signal proportional to the exciting current to the objective lens 8 (namely, a control signal to the objective lens 8 or a signal based thereon) from the exciting current control unit 13, which controls the exciting current to the objective lens 8 of the SEM 17, and then causes a current of a corresponding magnitude to flow through the internal coils 29 of the corrective magnetic field generating unit 10. Namely, the exciting current control unit 13 varies the exciting current to the corrective magnetic field generating unit 10 in proportion to the amount of change in the exciting current to the objective lens 8 of the SEM 17. When it is necessary to excite the external coils 30, the control unit 13 also causes the exciting current to the external coils 30 in proportion to the amount of change in the exciting current to the objective lens 8 of the SEM 17.

In the present embodiment, too, the same effects as the first embodiment can be obtained. In the present embodiment, the displacement of the ion beam spot on the sample 7 is proportional to the magnitude of the magnetic field on the optical axis. Therefore, even if the magnetic field produced by the objective lens 8 of the SEM 17 varies, the ion beam spot can be maintained at the origin, i.e., the ion beam spot position of the case of the absence of magnetic field, at all times, and there is no isotope separation, either.

Third Embodiment

Figure 14:
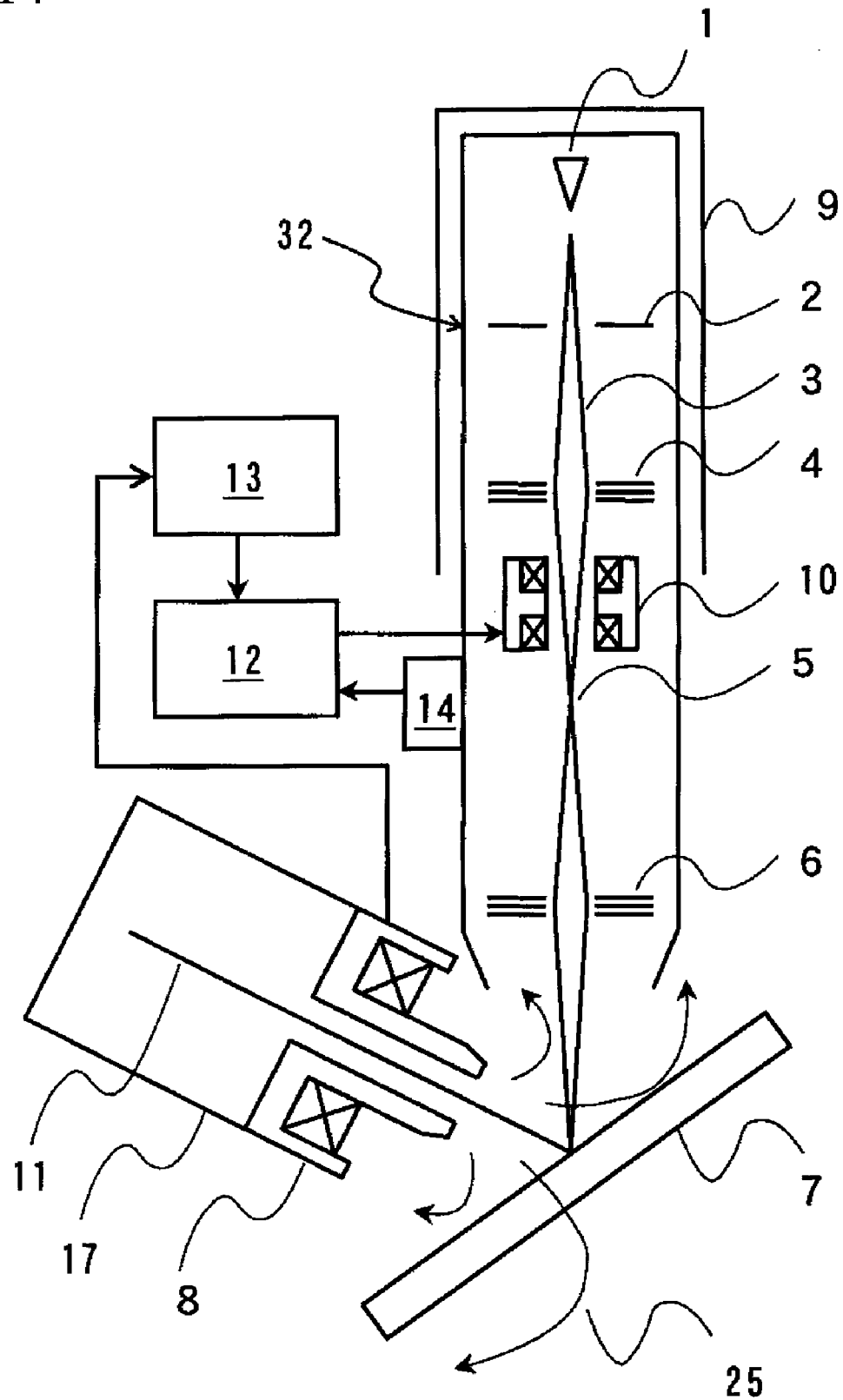
FIG. 14 shows a diagram for the description of a third embodiment of the invention.

When there is an external magnetic field that deflects the ion beam other than the magnetic field generated by the objective lens 8 of the SEM 17, where the magnitude of the external magnetic field varies, it is effective to measure the magnetic field that actually exists. In the present embodiment, as shown in FIG. 14, the structure of the second embodiment is additionally provided with a magnetic field probe 14, whose output is fed to the corrective magnetic field control unit 12. The magnetic field probe may comprise a Hall sensor, for example. It may, however, comprise any device as long as it is capable of measuring a magnetic field, such as a magnetoresistor sensor. In FIG. 14, portions designated with numerals not mentioned in the present embodiment are common with FIGS. 1 and 13.

When there is no magnetic field produced by the objective lens 8 of the SEM 17, the corrective magnetic field control unit 12 causes a current proportional to the magnetic field measured by the magnetic field probe 14 to flow through the coils of the corrective magnetic field generating unit 10.

Normally, the relative spatial distribution of a magnetic field may be considered uniform, with only its intensity factor varying uniformly. Thus, it is sufficient to measure the intensity of the magnetic field at an arbitrary point within the sample chamber in an arbitrary direction. However, in order to improve measurement sensitivity, such measurement should be conducted at a position and in a direction such that the intensity of the measured magnetic field can be maximized. When there are a plurality of sources of the magnetic field, for example, the relative spatial distribution of the magnetic field in the sample chamber may vary. In such case, a plurality of the magnetic field probes 14 are provided and their outputs are fed to the magnetic field control unit 12, which then causes a current to flow through the coils of the corrective magnetic field generating unit 10 that is proportional to the multiple inputs linearly combined. In this way, highly accurate correction can be made even when the relative spatial distribution of the magnetic field varies.

If the magnetic field produced by the objective lens 8 of the SEM 17 also fluctuates, the corrective magnetic field control unit 12 causes a current to flow through the coils of the corrective magnetic field generating unit 10 that represents an input signal proportional to the exciting current from the SEM objective lens exciting current control unit 13 to the SEM objective lens 8 and an input signal from the magnetic field probe 14 linearly combined with an appropriate ratio.

The displacement of the ion beam spot on the sample 7 is proportional to the magnitude of the magnetic field on the optical axis. Thus, in accordance with the structure of the present embodiment, even when the magnetic field produced by the objective lens 8 of the SEM 17 and/or other external magnetic field varies, the ion beam spot can be maintained at the origin, namely, the ion beam spot position of the case of the absence of magnetic field, and there is also no isotope separation.

In the present embodiment, too, the same effects as those of the foregoing embodiments can be obtained, so that the position of the ion beam spot can be optimized by tracking the changes in the external magnetic field produced by sources other than the objective lens 8 of the SEM 17.

Fourth Embodiment

Figure 15:
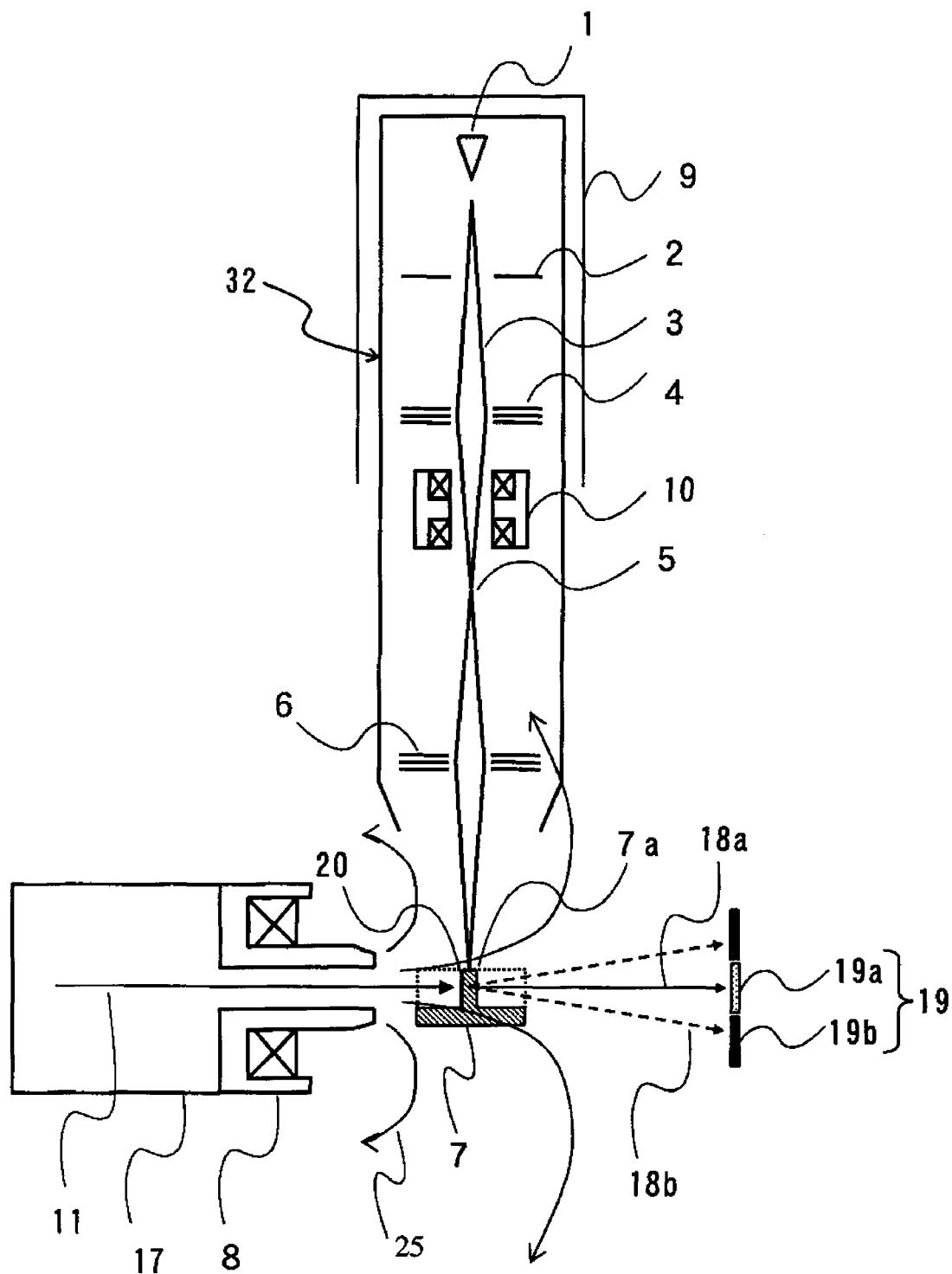
FIG. 15 shows a diagram for the description of a fourth embodiment of the invention.

A fourth embodiment of the invention is shown in FIG. 15. Portions similar to those of the already-described drawings or portions having the same functions are designated with similar numerals and their descriptions are omitted.

With reference to FIG. 15, the optical axis of the electron beam 11 of the SEM 17 intersects the optical axis of the ion beam 3 at substantially right angles at an intersection 20 on the sample 7. An electron detector 19 is disposed on the optical axis of the electron beam 11 of the SEM 17 at the opposite side of the objective lens 8 of the SEM 17 with respect to the intersection 20. In the present embodiment, the SEM 17 is used as a scanning transmission electron microscope (STEM).

In the case of the present embodiment, the periphery of the sample 7 for STEM observation is subjected to FIB processing with the ion beam 3 so that desired portions of the sample remain in the form of a thin film 7a. A path for the electron beam 11 that becomes incident on the thin-film sample 7a and a path for a transmission electron beam 18 that is transmitted thereby and travels toward the electron detector 19 are also ensured by FIB processing. The transmission electron beam 18 consists of a small-angle scattering transmission electron beam 18a that travels in substantially the same direction as the incident direction, and a large-angle scattering transmission electron beam 18b that greatly deviates from the incident direction. These two components are detected by electron detectors 19a and 19b. When a scanning image is formed using the signals from the electron detectors 19a and 19b as brightness signals of the scanning image synchronized with the scanning of the incident electron beam, a bright field image and a dark field image are obtained. The scattering angle distribution of the transmitting electrons strongly depends on the atomic number of the sample: the larger the atomic number, the greater the proportion of large-angle scattering. Therefore, in a dark field image, an image with a strong atomic number contrast is obtained.

Because of the structure in which the electron beam axis and the ion beam axis are disposed at substantially right angles, the sample can be monitored or observed via its STEM image during or after FIB processing without having to move the thin-film sample 7a. The present example is particularly advantageous when applied to fabrication or observation involving fabrication in a pinpoint manner, such as device failure analysis. The sample 7 may be a small-piece sample that is separated from a wafer in advance, or a microsample collected from a wafer or the like within the same sample chamber by a microsampling method.

Obviously, in the present embodiment, too, the deflection of the ion beam 3 on the sample due to the leakage magnetic field from the objective lens 8 of the SEM 17 to the sample 7 and the separation of the isotope ion can be prevented by the corrective magnetic field generating unit 10. Therefore, the objective lens 8 of the SEM 17 can be disposed at a position such that its tip is 4 to 8 mm from the observed portion of the sample, for example. Thus, in addition to the enabling of SEM/STEM observation by the SEM 17, the embodiment is advantageous in that the resolution of the SEM 17 can be increased. While in the present embodiment the SEM 17 was configured such that it can be also used as an STEM, it is possible to use the SEM 17 simply as a TEM (transmission electron microscope).

While the various embodiments described above were concerned with the application of the invention to an FIB-SEM, the invention can also be applied to just a FIB apparatus where an external magnetic field acts on an ion beam.

The beam spot does not necessarily need to be circular in shape; the foregoing discussions concerning the present invention are equally valid in cases where the beam cross section is elliptical or linear in shape due to the influence of astigmatic aberration and the like. The shape of the beam spot in the context of the present invention is not at all limited.

Furthermore, while the vertex angle of the pole pieces 26a to 26d has been described as being 90°, as shown in FIG. 5, the angle is not limited to 90°.

In the foregoing description of the embodiments, the ion species contained in the ion beam were $^{69}$Ga and $^{71}$Ga. The ion species contained in the ion beam, however, are not limited to these. One well-known example of ion source other than Ga is Sn, in which case ions such as $Sn^+$, $Sn_2^+$, $Sn^{2+}$, and the like are simultaneously produced. Such examples where ion species having different mass/charge ratios are contained are not limited to isotopes, but they include allotropes, ions with different valencies, and even mixtures of totally different substances. In all of such cases, too, the invention enables, as in the embodiments of the invention, the formation of an ion beam spot without separation on the same position on the sample as in the case of the absence of magnetic field.

What is claimed is:

1. A focused ion beam apparatus for focusing an ion beam on a sample to process and/or observe the sample, the apparatus comprising:
   a corrective magnetic field generating unit disposed on the optical axis of the ion beam for producing a corrective magnetic field to correct the deflection of the ion beam due to the influence of an external magnetic field outside the focusing ion beam optical system,
   wherein the corrective magnetic field generating unit comprises two pole-piece pairs, each of which consisting of two pole pieces disposed adjacent to each other with a gap d, wherein the two pole-piece pairs are disposed opposite to each other across the optical axis of the ion beam, with a gap g which is greater than gap d,
   the corrective magnetic field generating unit further comprising:
   an internal coil wound on each of the four pole pieces; and
   an external coil wound on each of the two pole-piece pairs in such a manner as to surround the internal coils.

2. The focused ion beam apparatus according to claim 1, wherein the corrective magnetic field generating unit is disposed downstream of a position where the ion beam is focused in the ion beam optical system.

3. The focused ion beam apparatus according to claim 1, comprising an electron microscope disposed within the same sample chamber, the electron microscope having an objective lens for producing a magnetic field toward the sample.

4. The focused ion beam apparatus according to claim 3, wherein the optical axis of the electron microscope and the optical axis of the ion beam intersect each other on the sample.

5. The focused ion beam apparatus according to claim 3, wherein the optical axis of the electron microscope and the optical axis of the ion beam intersect each other at substantially light angles at an intersection on the sample, the apparatus further comprising an electron detector disposed on the optical axis of the electron microscope and on the side opposite to the objective lens of the electron microscope with respect to the intersection.

6. The focused ion beam apparatus according to claim 1, comprising a corrective magnetic field control unit for controlling the corrective magnetic field in such a manner as to track a fluctuation in the magnetic field produced by the objective lens of the electron microscope, based on an exciting current to the objective lens of the electron microscope.

7. The focused ion beam apparatus according to claim 1, comprising at least one magnetic field probe disposed near the ion beam optical axis, and a corrective magnetic field control unit for controlling the corrective magnetic field produced by the corrective magnetic field generating unit in such a manner as to track a fluctuation in the external magnetic field, based on the result of measurement by the magnetic field probe.

8. The focused ion beam apparatus according to claim 1, comprising a magnetic shield by which the ion beam optical system is covered.

9. The focused ion beam apparatus according to claim 8, wherein the magnetic shield covers a portion of the ion beam optical system that is further from the sample, wherein a distance L between an end surface of the magnetic shield toward the sample and the sample is given by the following equation:

$$\int_L^0 \frac{dz_1}{\sqrt{V_{acc} - \phi(z_1)}} \int_L^{z_1} B_y(z) dz = 0$$

wherein Vacc is an accelerating voltage of the ion beam, $\phi(z1)$ is a potential at a coordinate z1 on the optical axis, and By(z) indicates a magnetic field component perpendicular to the optical axis at a coordinate z on the optical axis, wherein the origin of the coordinates is located at an ion beam spot on the sample in the case of the absence of magnetic field.

10. The focused ion beam apparatus according to claim 1, wherein the ion beam comprises ion beams having a plurality of different mass/charge ratios.

11. The focused ion beam apparatus according to claim 10, wherein the ion beams with the plurality of different mass/charge ratios comprise a plurality of types of isotope ion beams.

12. The focused ion beam apparatus according to claim 1, wherein the ion source of the ion beam comprises a Ga liquid metal ion source.

13. The focused ion beam apparatus according to claim 1, wherein the corrective magnetic field generating unit is disposed on the ion beam optical axis and has an opening that passes all of the ion beams.

14. The focused ion beam apparatus according to claim 1, comprising a second corrective magnetic field generating unit disposed on the optical axis of the ion beam toward the sample, thereby constructing a two-stage, series configuration.

15. The focused ion beam apparatus according to claim 1, comprising an electrostatic deflector disposed on the optical axis of the ion beam more toward the sample than the corrective magnetic field generating unit.

16. A focused ion beam apparatus for focusing an ion beam on a sample to process and/or observe the sample, the apparatus comprising:
   a corrective magnetic field generating unit disposed on the optical axis of the ion beam for producing a corrective magnetic field to correct the deflection of the ion beam due to the influence of an external magnetic field outside the focusing ion beam optical system,
   wherein the corrective magnetic field generating unit comprises two pole pieces disposed opposite to each other across the ion beam optical axis, and a coil wound on each of the two pole pieces,
   wherein each of the two pole pieces is divided into two divided pieces, each of which is wound with an internal coil.

* * * * *